United States Patent [19]

Yonezu

[11] Patent Number: 5,108,942
[45] Date of Patent: Apr. 28, 1992

[54] MASTER SLICE INTEGRATED CIRCUIT HAVING A MEMORY REGION

[75] Inventor: Ryou Yonezu, Itami, Japan

[73] Assignee: Mitsubishi Denki Kabushiki Kaisha, Tokyo, Japan

[21] Appl. No.: 346,721

[22] Filed: May 3, 1989

Related U.S. Application Data

[62] Division of Ser. No. 165,470, Mar. 8, 1988, Pat. No. 4,849,932.

[30] Foreign Application Priority Data

Mar. 18, 1987 [JP] Japan ................. 62-64786

[51] Int. Cl.⁵ .................................. H01L 21/70
[52] U.S. Cl. ............................... 437/51; 437/52
[58] Field of Search ............ 365/489; 357/40, 41; 437/51, 52, 48; 364/490, 491

[56] References Cited

U.S. PATENT DOCUMENTS 4,623,911 11/1986 Pryor .
4,783,692 11/1988 Uratani ....................... 357/40

FOREIGN PATENT DOCUMENTS 0023025 5/1986 European Pat. Off. .

OTHER PUBLICATIONS

IEEE Journal of Solid State Circuits, vol. SC-20, No. 5 Oct. 1985, A 240K Transistor CMOS Array with Flexible Allocation of Memory and Channels, Horomasa Takahashi et al.

Primary Examiner—Olik Chaudhuri
Assistant Examiner—Tom Thomas
Attorney, Agent, or Firm—Oblon, Spivak, McClelland, Maier & Neustadt

[57] ABSTRACT

A gate array chip (33) has an array (41) of strip-shaped active areas (18) formed on a semiconductor substrate (40). Wiring-dedicated areas (34), each having capacity for two to four wires, are provided between respective adjacent pairs of the active areas (18). In a logic circuit region, one or more active areas (18) are employed as wiring areas. In memory blocks, wiring is performed by employing only the wiring-dedicated areas (34). A master slice integrated circuit manufactured from the gate array chip (33) has a high degree of integration and high operating speed.

8 Claims, 19 Drawing Sheets

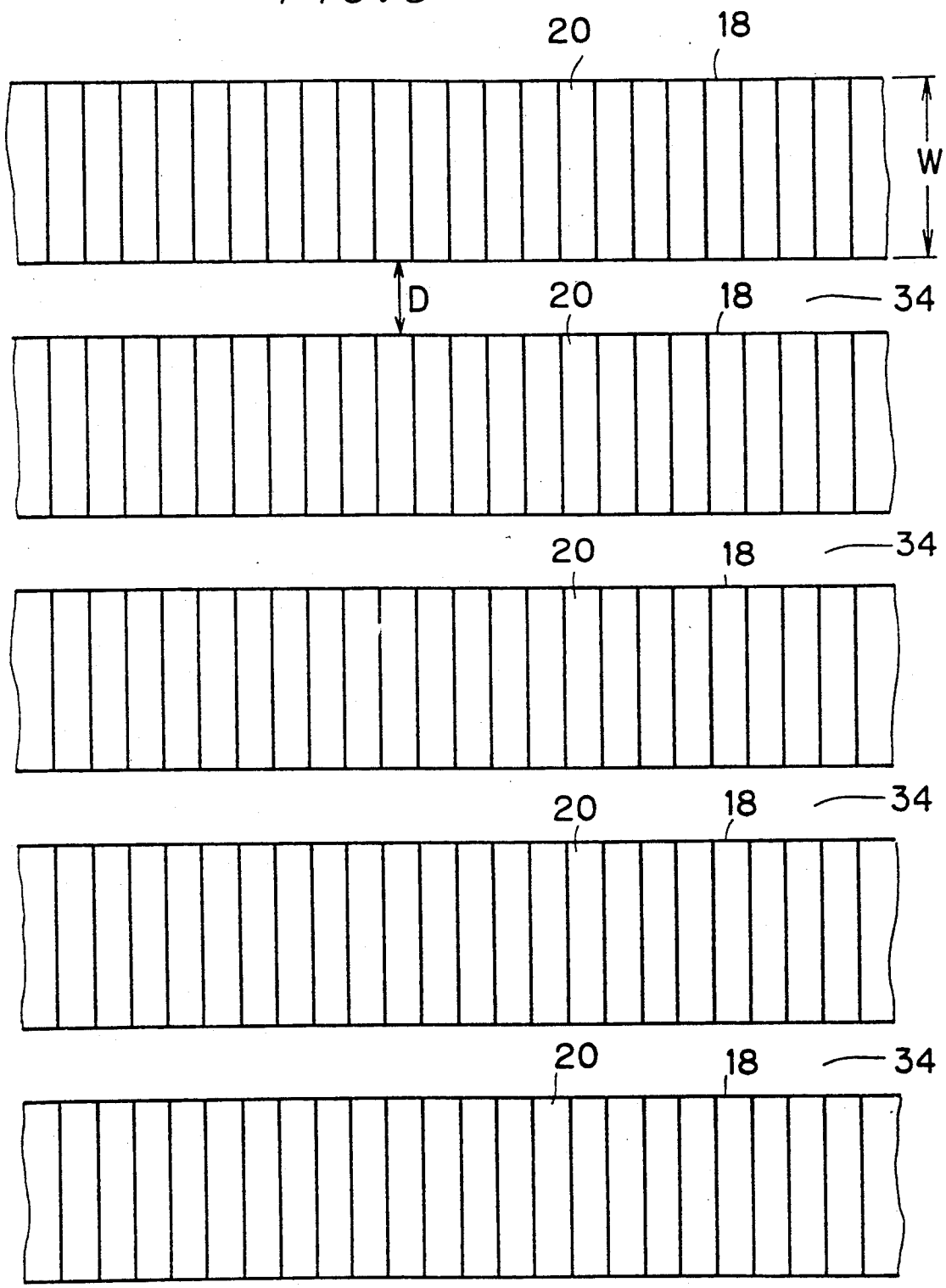

MASTER SLICE INTEGRATED CIRCUIT HAVING A MEMORY REGION

This is a division of application Ser. No. 07/165,470, filed on Mar. 8, 1988, now U.S. Pat. No. 4,849,932.

BACKGROUND OF THE INVENTION

Field of the Invention

The present invention relates to a master slice integrated circuit having a memory region formed by macrocells, and more particularly, it relates to technique for improving a degree of integration in a master slice integrated circuit.

Description of the Prior Art

In a master slice large-scale integrated circuit (LSI), a logic circuit and a memory are often formed on a single gate array chip. In order to maintain universality of the gate array chip, the memory is preferably formed by an array of macrocells, not by a memory-dedicated region (a region dedicated only to a memory). FIG. 1 illustrates a first example of a gate array chip, which can be provided thereon with a memory and a logic circuit formed by macrocells.

Referring to FIG. 1, a gate array chip 16a is formed thereon with a parallel array of strip-shaped active areas 18. Strip-shaped wiring areas 19 of width D1 are arranged between respective adjacent pairs of the active areas 18. A plurality of input/output interface buffer areas 17 are formed to enclose the parallel array of the active areas 18.

FIG. 2 is a partially enlarged view of FIG. 1. Each of the active areas 18 is formed by a one-dimensional array of basic transistor cells 20. Macrocells for the logic circuit and the memory can be formed by interconnecting such basic transistor cells 20. As shown in FIG. 3, ten to forty lateral wires 21, for example, can be formed in each wiring area 19. Namely, the width D1 of each wiring area 19 is so determined as to receive ten or more lateral wires 21.

The parallel array of the active areas 18 as shown in FIG. 1 is partially employed as a memory region MR, and the remaining part is employed for the logic circuit. Since a large number of the lateral wires 21 are required for forming the logic circuit, the width D1 of the wiring areas 19 is preferably large to some extent, in order to form the logic circuit. On the other hand, the memory region MR requires no large number of lateral wires, but the most part of wires are formed by vertical wires 22 such as word lines. The width D1 of the wiring areas 19 is preferably small in order to form the vertical wires 22. If the width D1 is large, the vertical wires 22 are followingly increased in length, to reduce the degree of integration and the operating speed of the memory region MR.

Thus, the width D1 required for the logic circuit is contradictory to that required for the memory region MR. If the requirement for the logic circuit is satisfied, the degree of integration and the operating speed MR are undesirably reduced. In the conventional device, the width D1 is set within a range of 40 to 80 μm.

FIG. 4 shows another conventional gate array chip 16b, which has been developed in order to improve the degree of integration of a master slice LSI. Continuously arrayed strip-shaped active areas 18 are provided on the gate array chip 16b. Wiring areas 19 are provided only around the array of the active areas 18, but not between adjacent ones of the active areas 18. Such situation can also be understood from FIG. 5, which is a partially enlarged view of FIG. 4. If lateral wires are required between any adjacent pair of active areas 18, one or more active areas 18 are employed as wiring areas. As shown in FIG. 6, for example, an active area 18b provided between active areas 18a and 18c is employed as a wiring area 19a, which is provided thereon with lateral wires 21. The maximum number of such lateral wires 21, which can be provided in the wiring area 19a, is defined by width (vertical width in FIG. 6) of the active area 18b. Therefore, a plurality of continuous active areas are employed as wiring areas if a large number of lateral wires 21 are required.

In a master slice LSI formed by such a gate array chip 16b, the wiring areas to be provided between adjacent pairs of active areas used for macrocells can be changed in size at need. However, the size of such wiring areas must be integral times the width of the active areas 18. For example, when each of the active areas 18 can receive nine lateral wires 21 while required are thirteen lateral wires 21, two active areas 18 are employed as wiring areas. In this case, a space for $(9 \times 2 - 13) =$ five wires is not used and wasted. Thus, the degree of integration is not increased also in the gate array chip 16b as shown in FIG. 4.

The degree of integration is further reduced by positional relation between a logic circuit region and a memory region on the gate array chip 16b. If a logic circuit region LR and a memory region MR are adjacent to each other longitudinally along active areas 18 as shown in FIG. 7, vertical width of wiring areas 19a is determined by the number of lateral wires 21 required for the logic circuit region LR. In other words, the number of the lateral wires 21 required for interconnecting logic macrocells 23, which are shown with slanting lines, defines the size of the wiring areas 19a. Thus, the vertical interval of memory macrocells 4 formed by the active areas 18 is undesirably increased, to increase the length of vertical wires 22 such as word lines. Since the vertical width of the wiring areas 19a is restricted to integral times the vertical width of the active areas 18, the wiring areas 19a occupy spaces in excess of those substantially required for the respective ones of the logic circuit region LR and the memory region MR.

Increase in length of the vertical wires 22 applies unwanted load on the operation of the entire circuit formed on the gate array chip, whereby the operating speed of the circuit is reduced.

SUMMARY OF THE INVENTION

A master slice integrated circuit according to the present invention comprises: (a) a semiconductor substrate; (b) a memory circuit formed on a memory region defined on the semiconductor substrate and having (b-1) an array of memory macrocells formed through use of a first part of an array of strip-shaped active areas formed on the semiconductor substrate, wherein said active areas are arrayed along a first direction perpendicular to a second direction which is a longitudinal direction of the active areas, wiring-dedicated areas are provided between respective adjacent pairs of the active areas and wiring capacity of each of the wiring-dedicated areas with respect to wiring in the second direction is determined according to a requirement for wiring to the memory macrocells in the second direction, (b-2) decoder macrocells formed through use of a second part of the array of the active areas for decoding an address signal supplied to the memory circuit, and (b-3) first wires provided in the wiring-dedicated areas and connected to the memory macrocells and/or the decoder macrocells; and (c) a logic circuit formed in a logic circuit region which is separated from the memory region in the first direction on the semiconductor substrate and having (c-1) logic macrocells formed through skipping use of a third part of the array of the active areas, and (c-2) second wires formed on the wiring-dedicated areas and parts of the active areas existing between said logic macrocells, said second wires being connected to the logic macrocells. The active areas which are provided thereon with the second wires are not employed as the macrocells.

The present invention is further directed to a method of manufacturing a master slice integrated circuit having a logic circuit and a memory circuit, which comprises: a first step of preparing a semiconductor substrate; a second step of forming an array of strip-shaped active areas on the semiconductor substrate to obtain a gate array chip, in which each of the active areas has a plurality of active elements (transistor basic cells, for example), the active areas are allayed along a first direction perpendicular to a second direction which is a longitudinal direction of the active areas, and wiring-dedicated areas each having wiring capacity selected from numbers of two, three and four with respect to wiring in the second direction, are provided between respective adjacent pairs of the active areas, a third step of determining a layout of the logic circuit and the memory circuit on the gate array chip; and a fourth step of performing wiring on the gate array chip along the layout to obtain a master slice integrated circuit. The active areas are partially employed as wiring areas.

According to the present invention, a gate array chip employed for manufacturing a master slice integrated circuit having a logic circuit and a memory circuit comprises: a semiconductor substrate; and an array of strip-shaped active areas formed on the semiconductor substrate along a first direction perpendicular to a second direction which is a longitudinal direction of the active areas, and wiring-dedicated areas, each having wiring capacity selected from numbers two, three or four with respect to wiring along the second direction, are provided between respective adjacent pairs of the active areas, while the active areas can be employed as areas for wiring.

Accordingly, an object of the present invention is to improve the degree of integration and the operating speed of a master slice integrated circuit which has a logic circuit and a memory formed through use of macrocells.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a partially enlarged view of the gate array chip shown in FIG. 8;

DESCRIPTION OF THE PREFERRED EMBODIMENT

Figure 1:
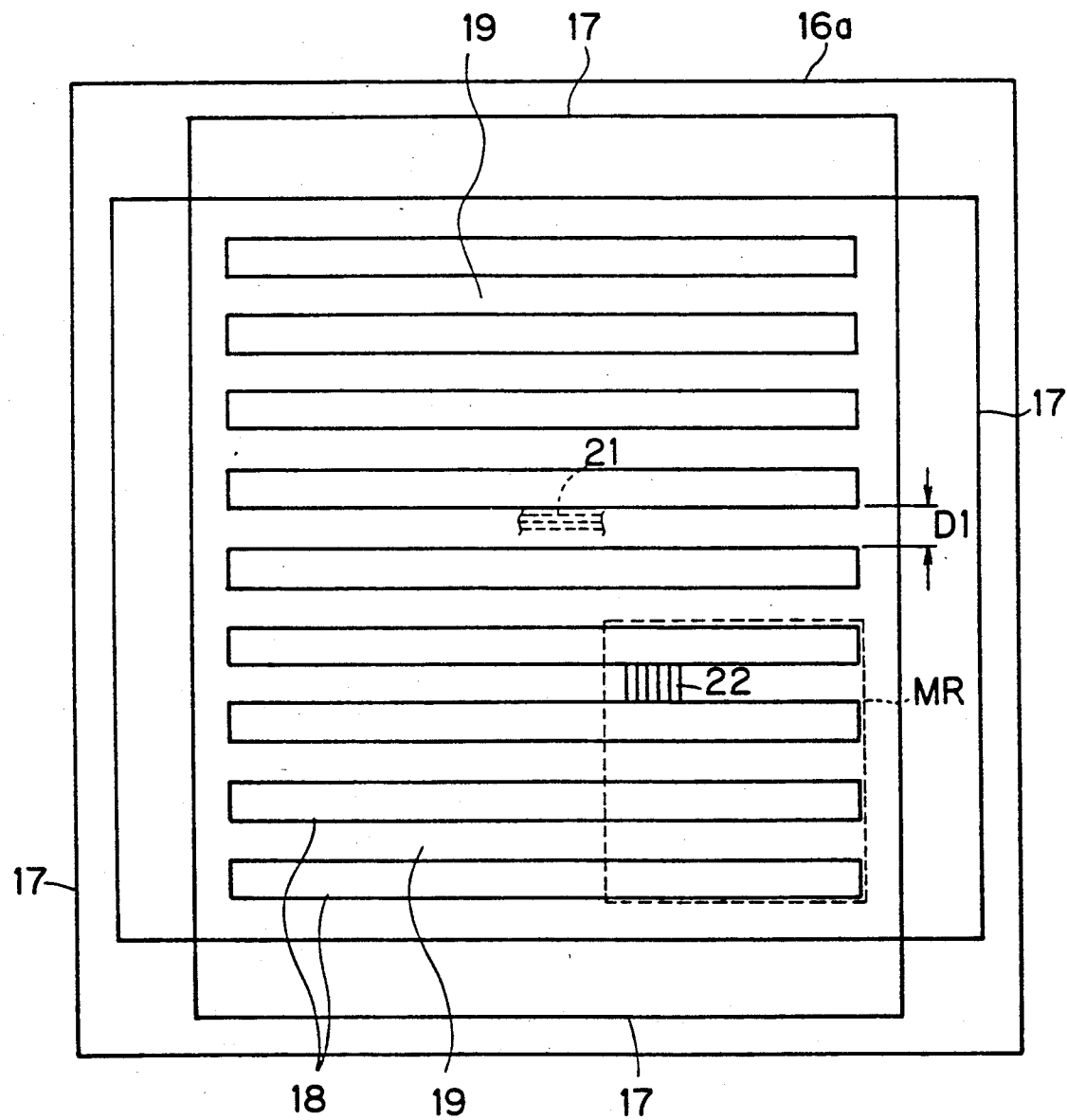
FIG. 1 is a schematic plan view showing a gate array chip employed for a conventional master slice LSI.
Figure 2:
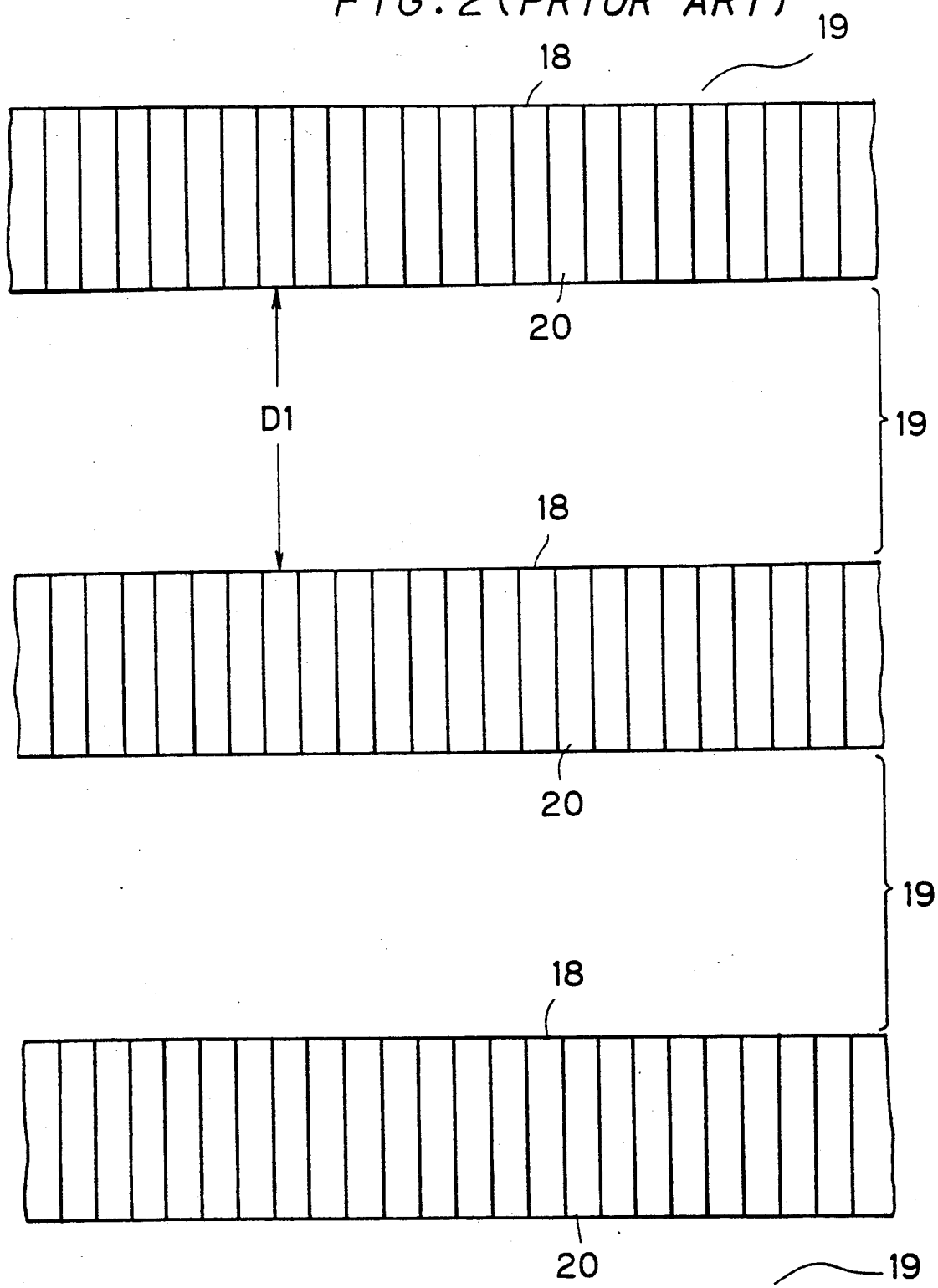
FIG. 2 is a partially enlarged view of the gate array chip as shown in FIG. 1.
Figure 3:
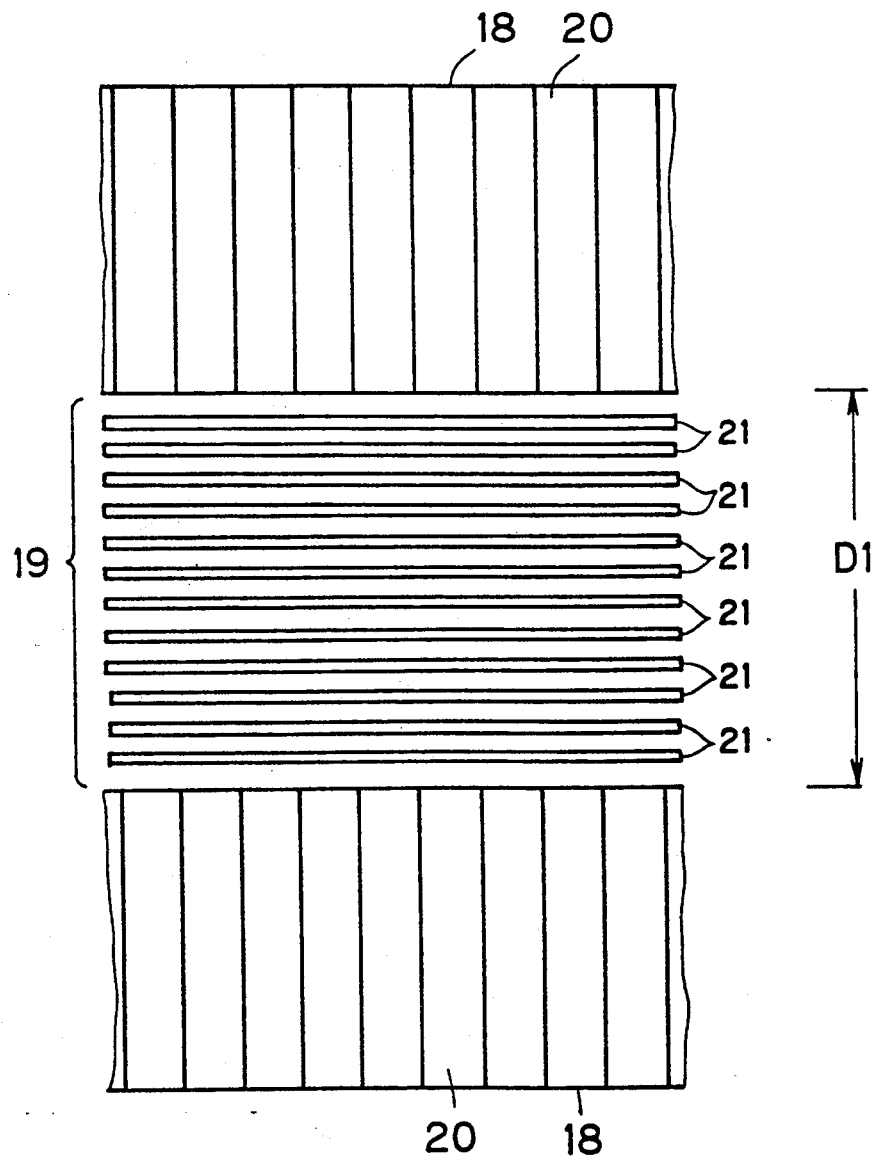
FIG. 3 illustrates wires to be provided on the gate array chip shown in FIG. 1.
Figure 4:
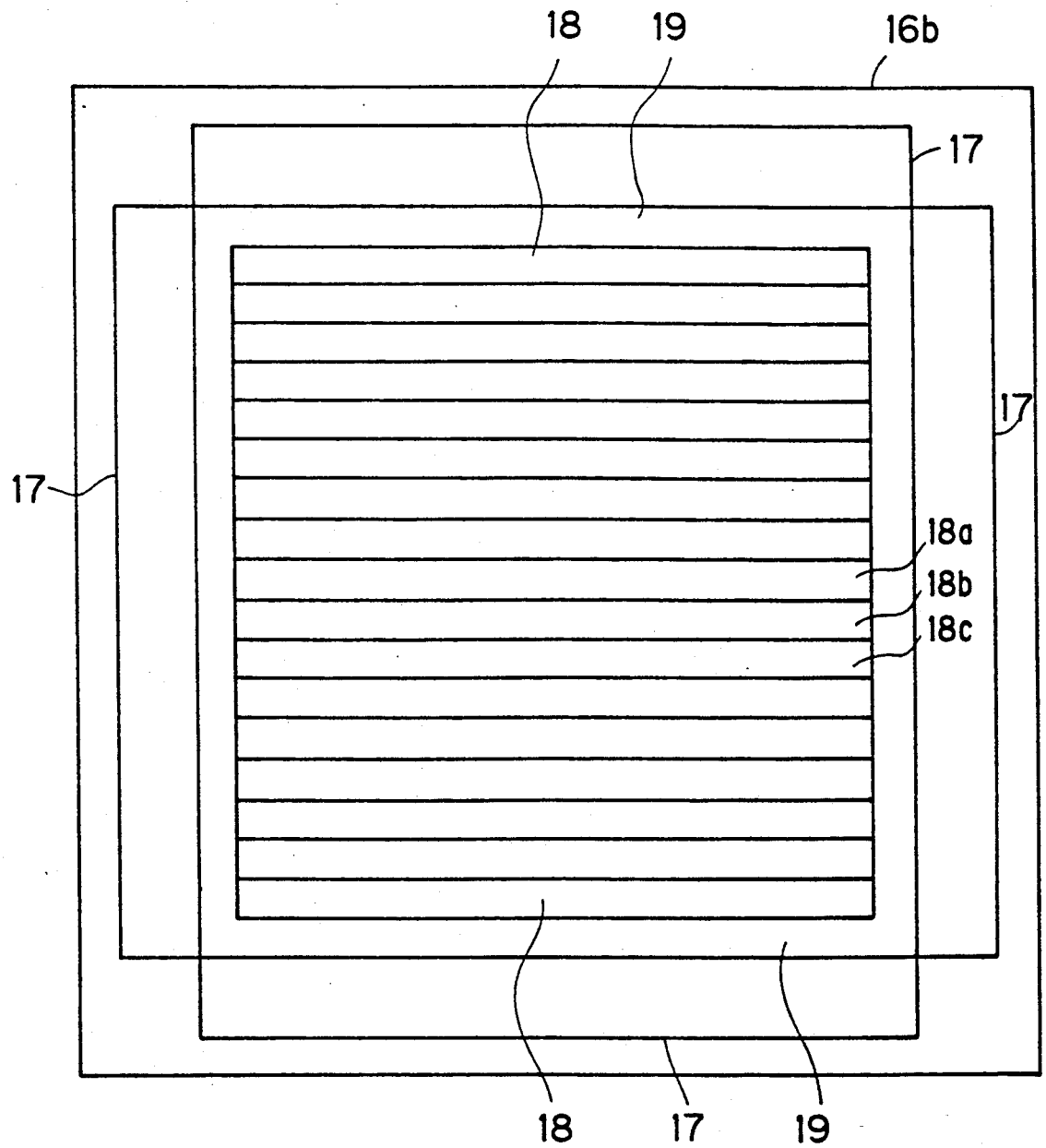
FIG. 4 is a schematic plan view showing a gate array chip employed for another conventional master slice LSI.
Figure 5:
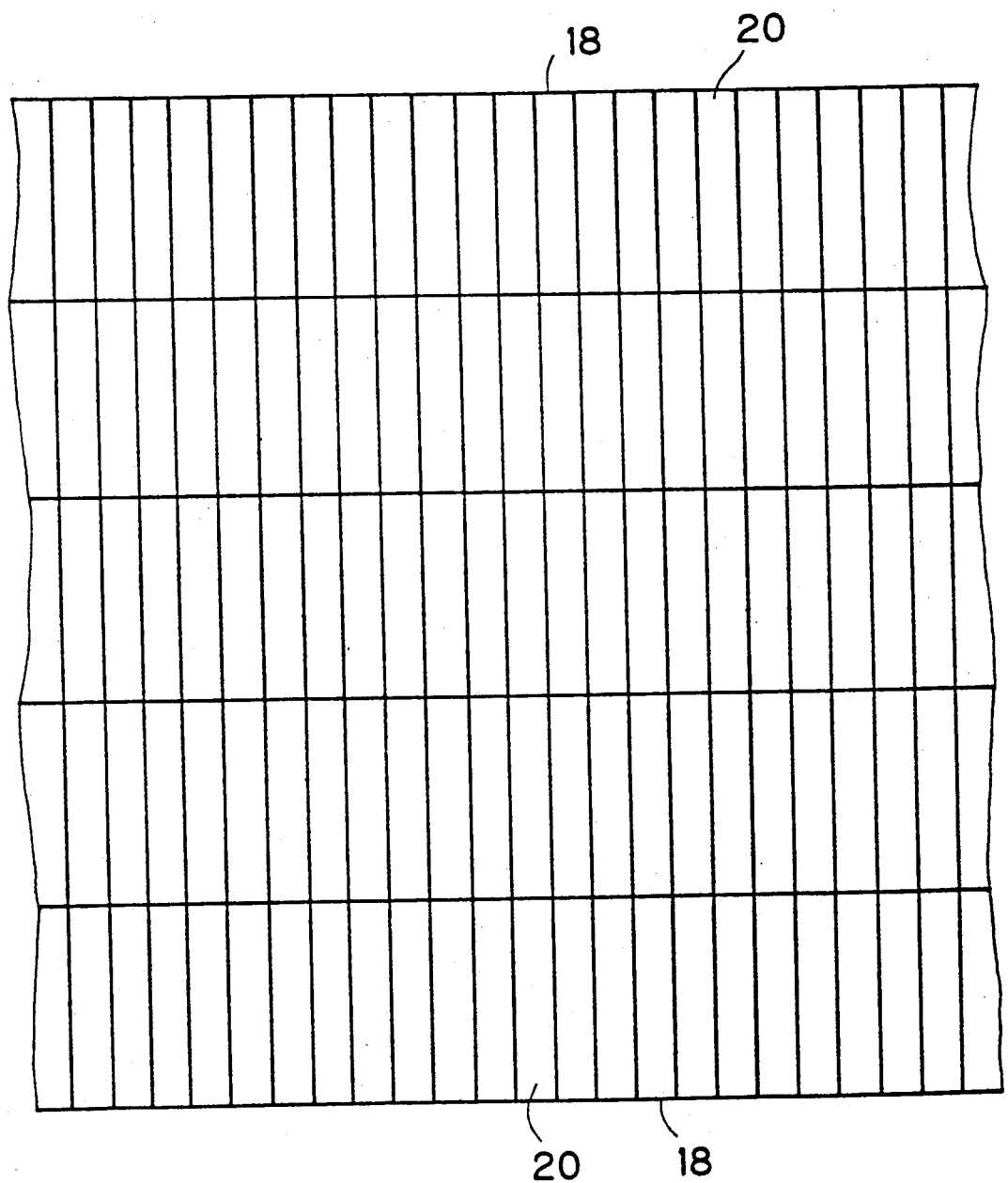
FIG. 5 is a partially enlarged view of the gate array chip shown in FIG. 4.
Figure 6:
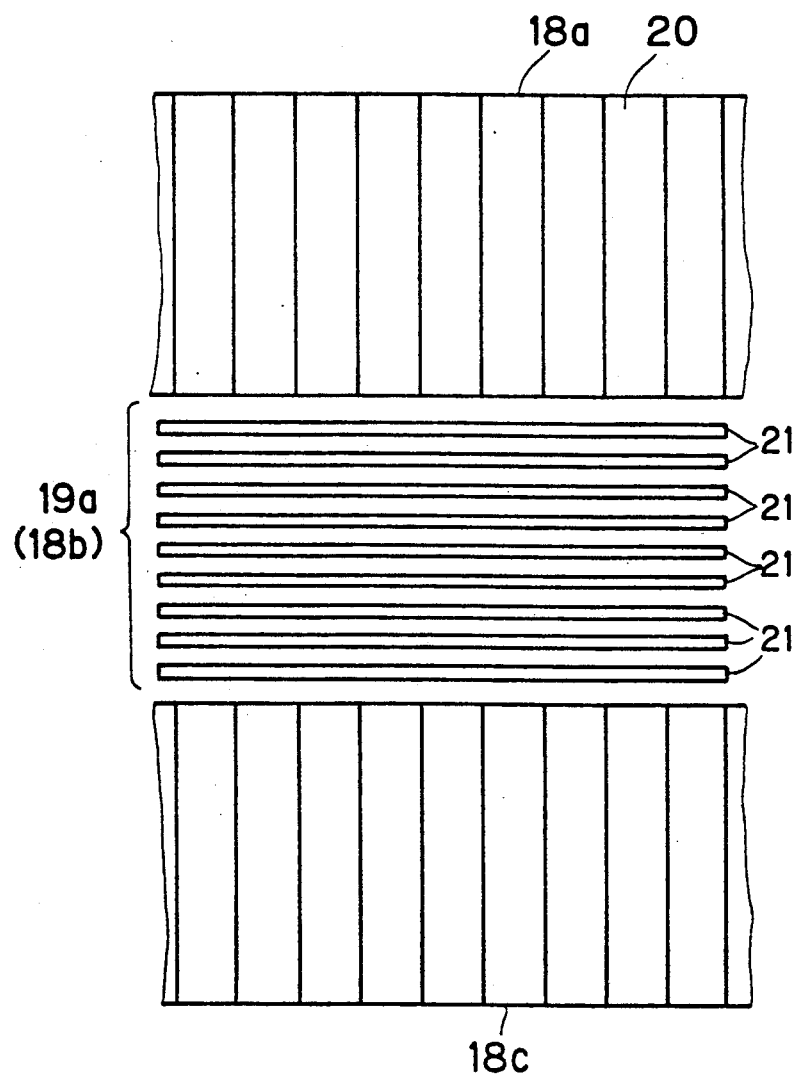
FIG. 6 illustrates wires to be provided on the gate array chip shown in FIG. 4.
Figure 7:
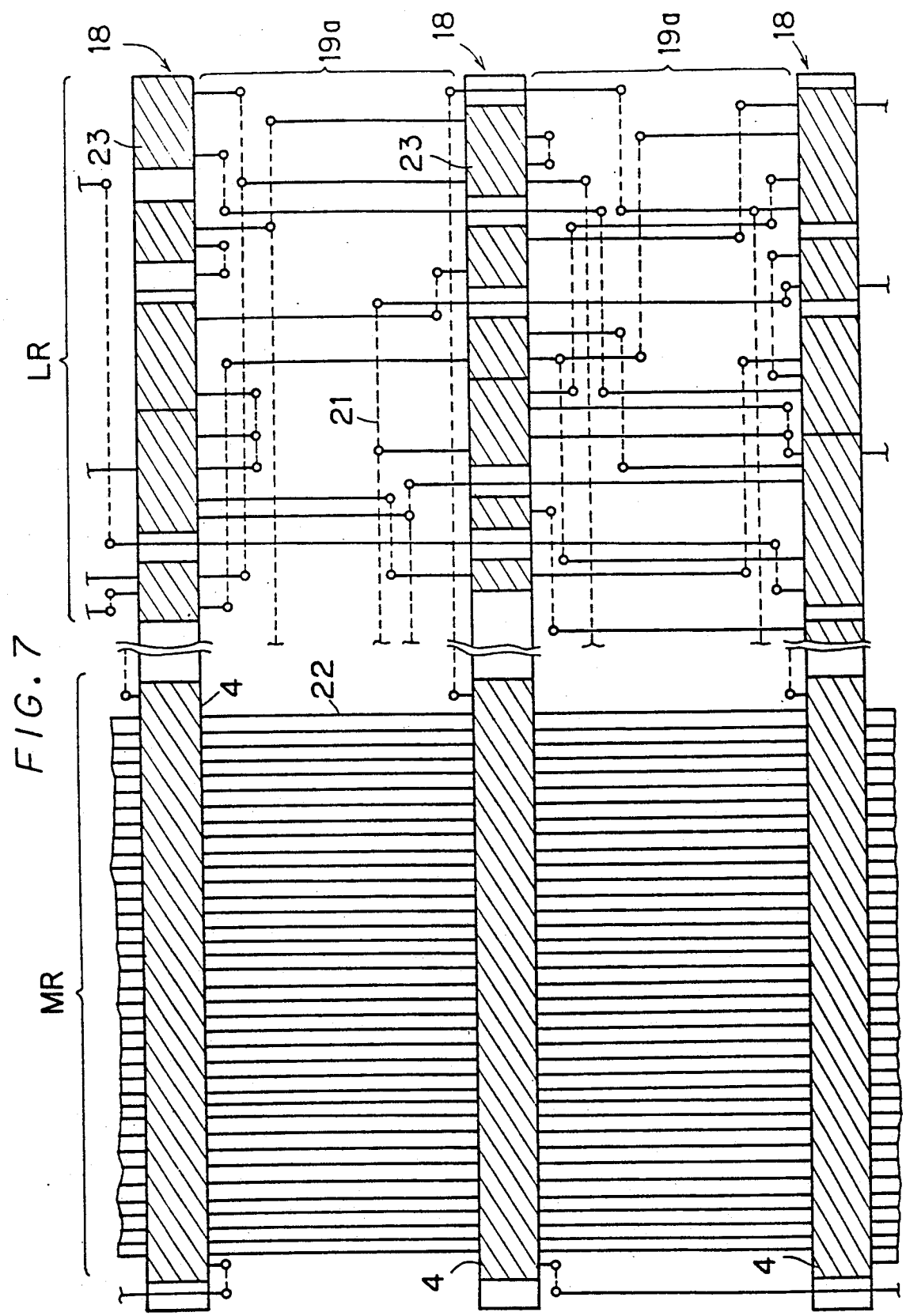
FIG. 7 is an explanatory diagram showing wires in a logic circuit region and a memory region.
Figure 8:
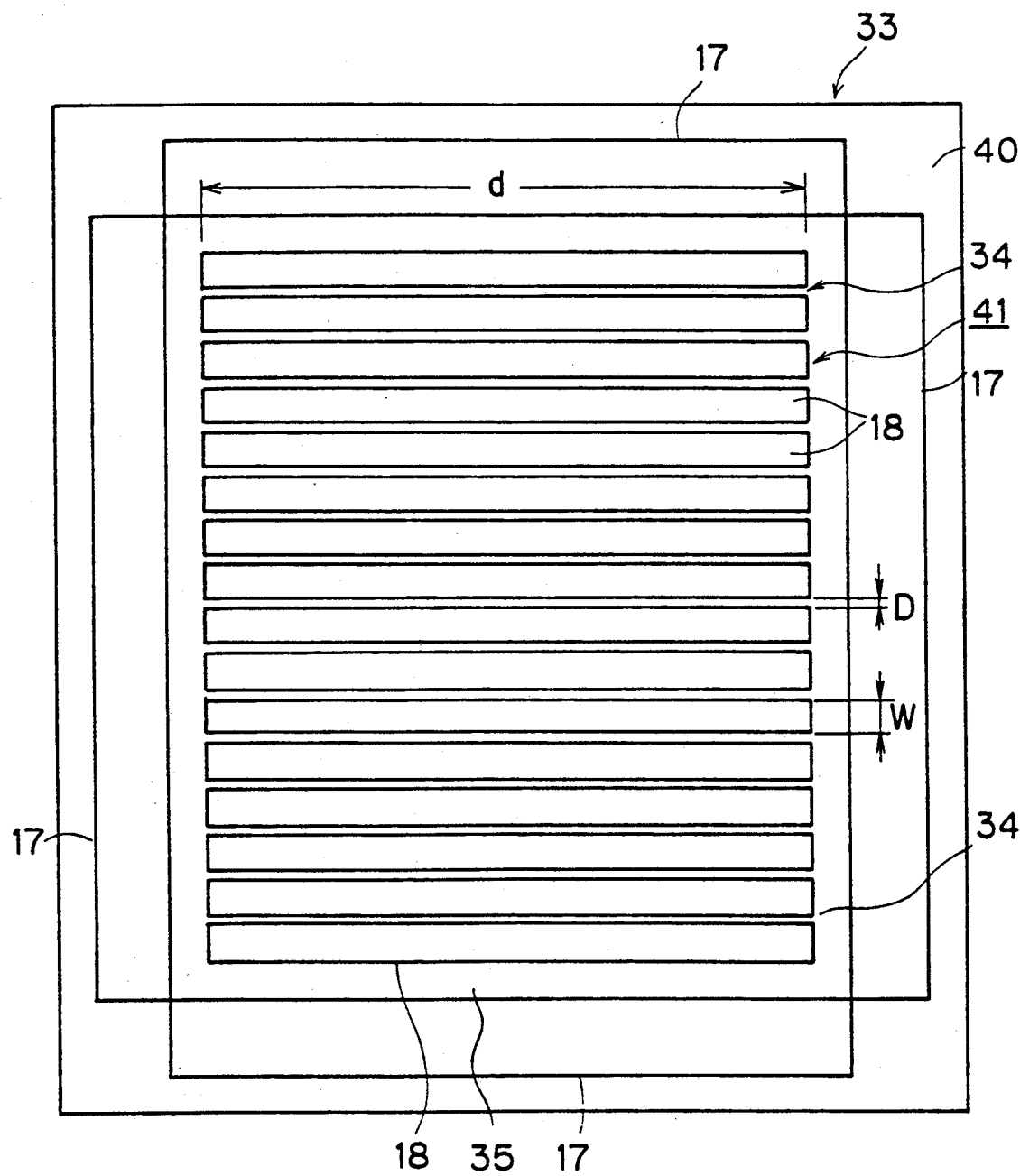
FIG. 8 is a schematic plan view showing a gate array chip employed in an embodiment of the present invention.

FIG. 8 is a schematic plan view showing a gate array chip 33 which is employed for a master slice LSI according to an embodiment of the present invention. The gate array chip (gate array chip body) 33 has a parallel array 41 of strip-shaped active areas 18 which are formed on one major surface of a semiconductor substrate 40. The direction of the parallel array 41 is perpendicular to the longitudinal direction of the active areas 18. Input/output interface buffer areas 17 are provided to enclose the parallel array 41 of the active areas 18. As shown in FIG. 9 in a partially enlarged manner, each of the active areas 18 is formed by a one-dimensional array of basic transistor cells 20, each of which is formed by a combination of a P-type MOSFET and an N-type MOSFET, for example. Width W of each active area 18 is set at a required value of 50 to 60 μm, for example, for forming the basic transistor cells 20. Length d of each active area 18 is determined according to the number of the basic transistor cells 20 formed therein.

Figure 10A:
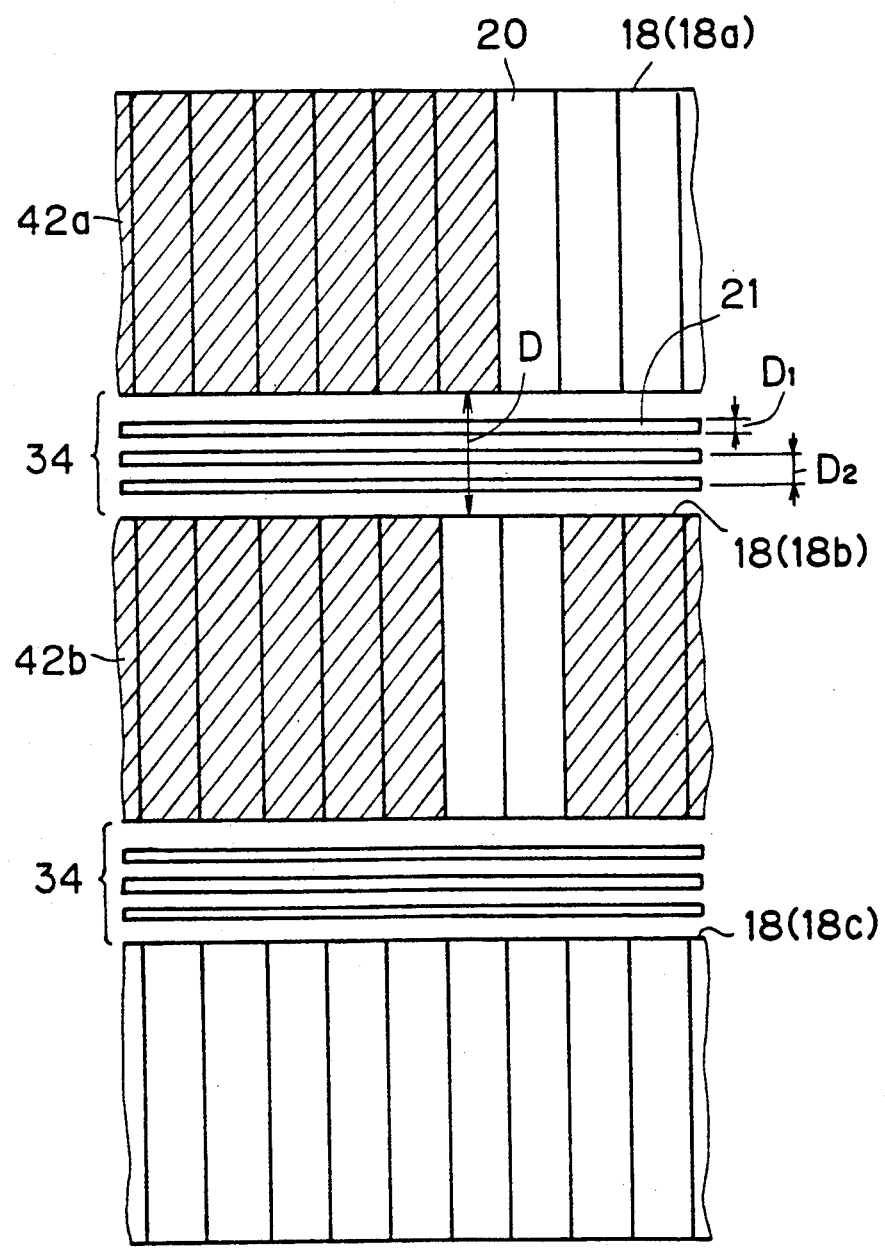
FIGS. 10A and 10B are explanatory diagrams of wires in the gate array chip shown in FIG. 8.

Non-active areas 34 of width D are provided between respective adjacent pairs of active areas 18, to be employed as wiring-dedicated areas. Namely, the parallel array 41 is formed by alternately arranging the active areas 18 of the width W and the non-active areas (wiring-dedicated areas) 34 in a parallel manner. The width D is 12 to 20 μm, for example. Lateral wires and/or vertical wires are formed on the wiring-dedicated areas 34. The lateral wires extend along the longitudinal direction of the active areas 18, and the vertical wires extend along the cross direction of the active areas 18. Width $D_1$ of each lateral wire 21 shown in FIG. 10A is 2 μm, for example, and a pitch D₂ for arranging such lateral wires 21 is 4 μm, for example. Thus, each of the wiring-dedicated areas 34 can be provided with two to four lateral wires 21. In the example as shown in FIG. 10A, three lateral wires 21 can be provided in each wiring-dedicated area 34. In other words, each of the wiring-dedicated areas 34 has wiring capacity (track capacity) for three wires. Non-active areas 35 are present between the parallel array 41 and the input/output interface buffer areas 17. The size of the non-active areas 35 is arbitrarily determined, while wires between the parallel array 41 and the input/output interface buffer areas 17 etc. are provided on the non-active areas 35.

Figure 10B:
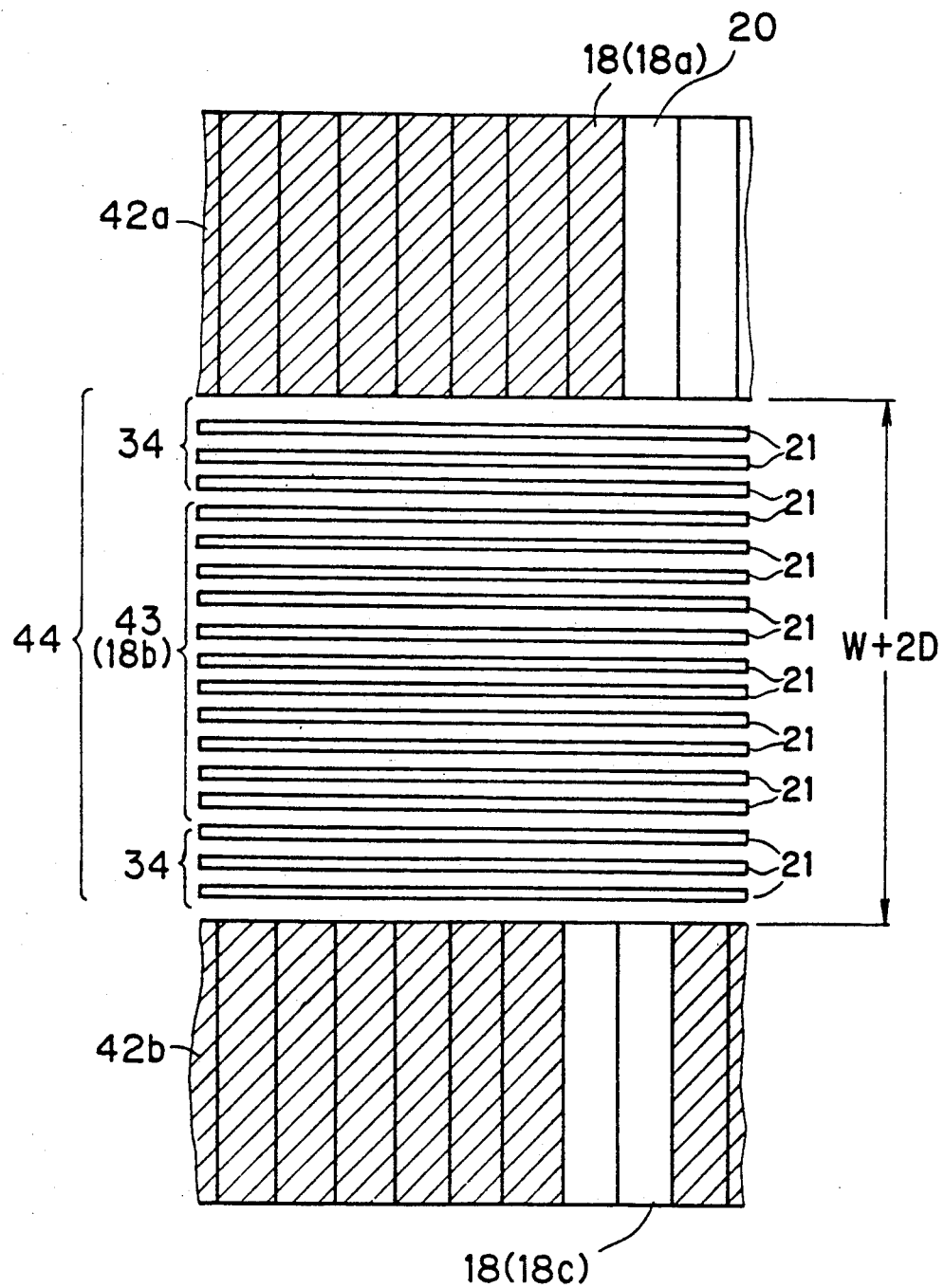

The gate array chip 33 itself has no lateral or vertical wires. As well known in the field of gate array technique, wiring is performed on the gate array chip 33 in accordance with the user's needs, thereby to obtain a desired master slice LSI. If three or less lateral wires 21 are required between each adjacent pair of macrocell rows 42a and 42b, which are shown with slanting lines, an adjacent pair of active areas 18a and 18b (FIG. 10A) are employed to form the macrocell rows 42a and 42b respectively, while the lateral wires 21 are actually provided in each wiring-dedicated area 34 provided between the active areas 18a and 18b. If four or more lateral wires 21 are required between the adjacent pair of macrocell rows 42a and 42b, one or more active areas 18 are employed as wiring areas. The number of such active areas 18 employed as the wiring areas depends on the width W of the active areas 18. If, for example, eleven lateral wires can be received in each active area 18, seventeen lateral wires 21 can be provided between active areas 18a and 18c by employing an active area 18b as a wiring area 43, as shown in FIG. 10B. In this case, macrocell rows 42a and 42b to be adjacent to each other are formed by the active areas 18a and 18c, respectively.

If eighteen or more lateral wires 21 are required, the active area 18c is also employed as a wiring area. Every time an active area 18 is employed as a wiring area, wiring capacity of the wiring area 44 between each adjacent pair of macrocell rows 42a and 42b is increased by fourteen.

Thus, in the gate array chip 33 shown in FIG. 8, one or more active areas 18 are employed as the wiring areas depending on the number of the lateral wires 21 of the circuit to be formed by the same. In a part requiring a small number of lateral wires 21, wiring can be performed only by the wiring-dedicated area 34. The width D of such wiring-dedicated area 34 is determined according to the number of the lateral wires 21 required in a memory block to be formed in a part of the gate array chip 33. If three lateral wires 21 are required between each pair of macrocells which are vertically adjacent to each other in the memory block, the width D is determined so that three lateral wires 21 can be provided in each wiring-dedicated area 34. Thus, a memory circuit can be formed in the memory block without employing the active areas 18 as wiring areas 43. Since a logic circuit requires a relatively large number of lateral wires 21, the active areas 18 are employed as the wiring areas 43 in a part to be provided with a logic circuit.

Figure 11:
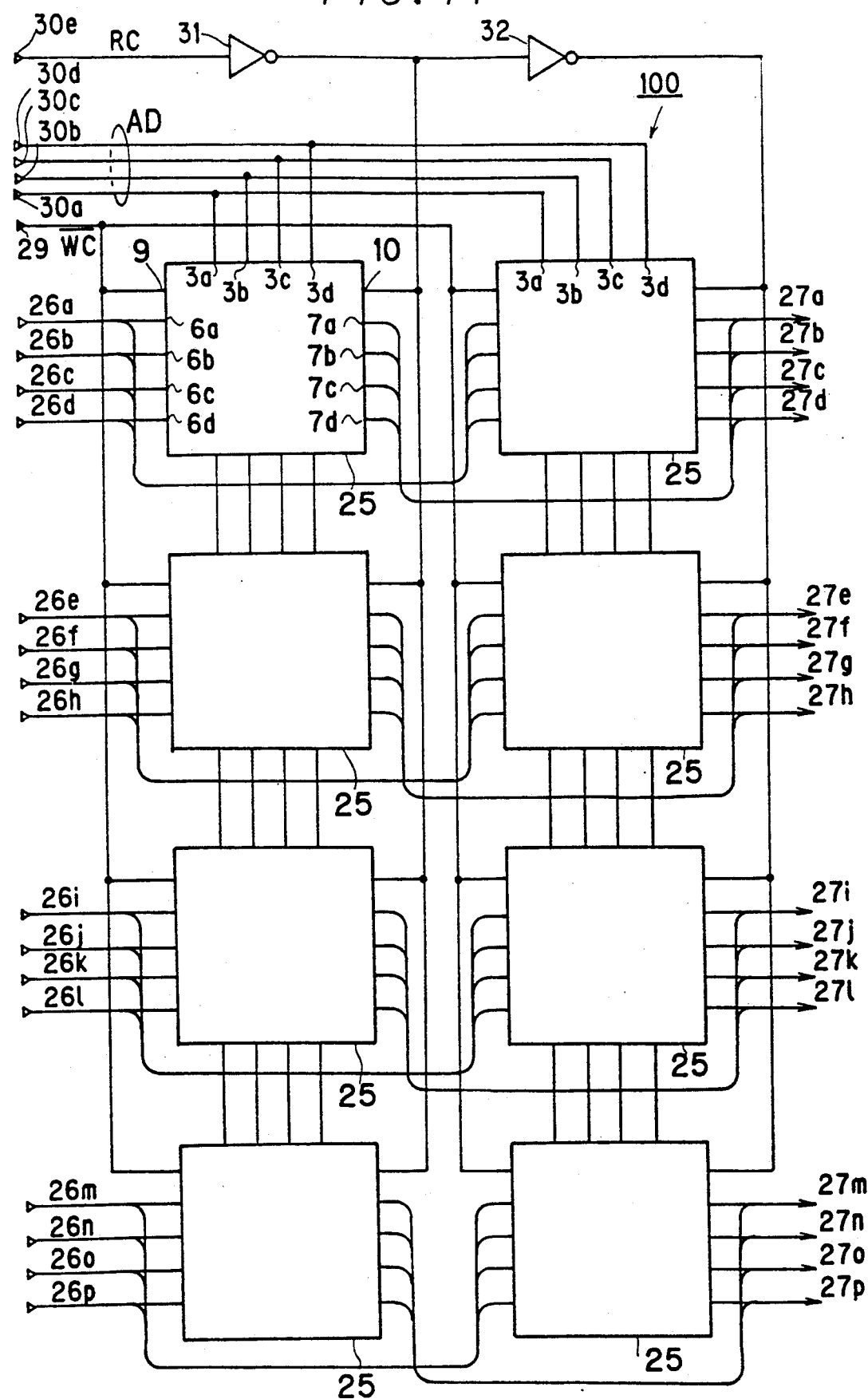
FIG. 11 is a circuit diagram of a random access memory formed on the gate array chip.
Figure 12:
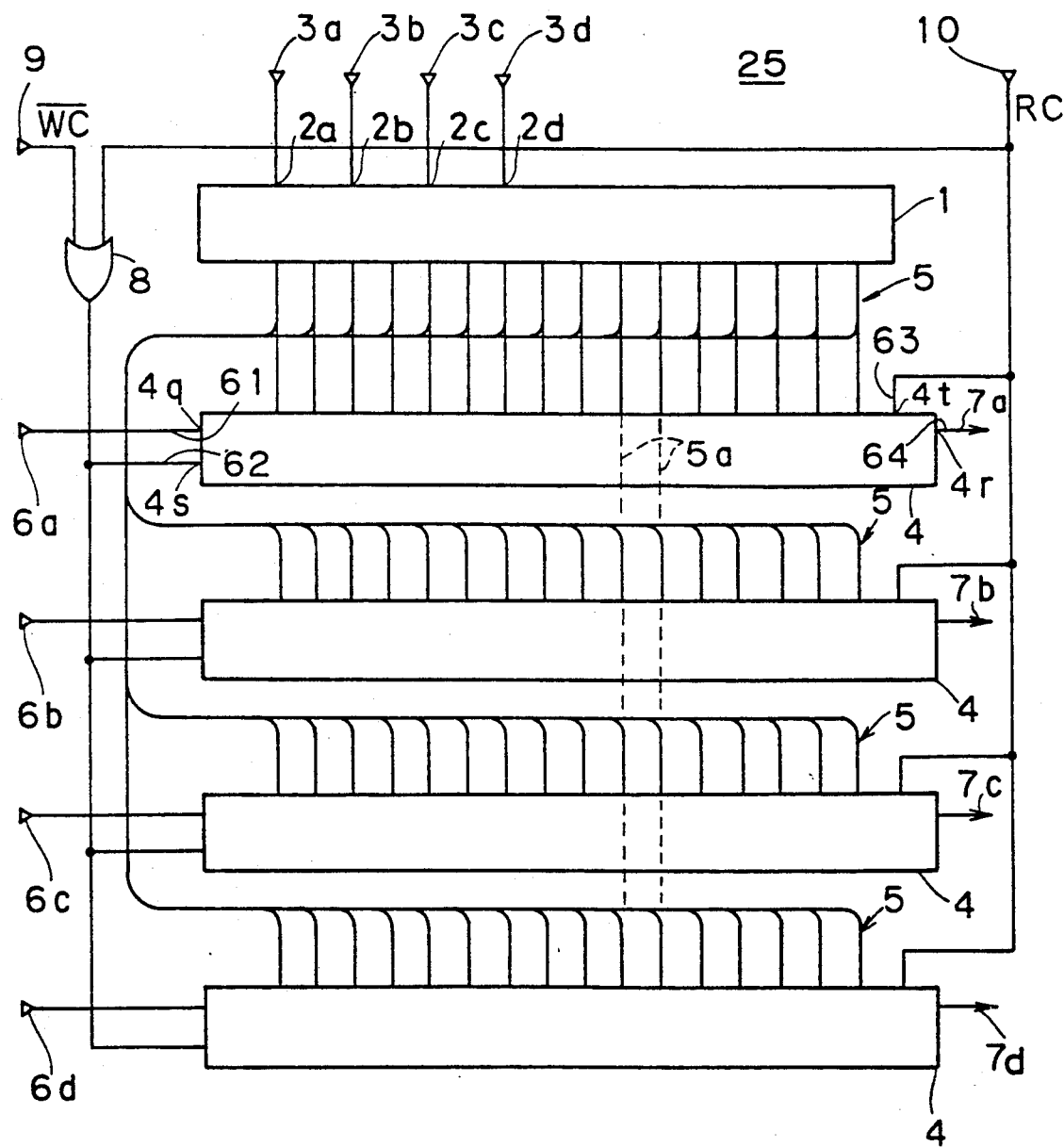
FIG. 12 is a circuit diagram of a memory block.

FIG. 11 is a circuit diagram of a RAM 100, which is to be formed on the gate array chip 33 in this embodiment. The RAM 100 has eight RAM blocks 25 of sixteen words by four bits each. FIG. 12 shows the internal structure of each RAM block 25. Each of four-bit address signals AD inputted from address input terminals 30a to 30d shown in FIG. 11 is supplied to input terminals 2a to 2d of each decoder macrocell 1 (FIG. 12). The decoder macrocell 1 is formed through use of the active areas 18 of the gate array chip 33.

The decoder 1 decodes the inputted address signal AD to generate a word selecting signal, which in turn is supplied to four RAM macrocells 4 through word lines 5. The RAM macrocells 4 are also formed through use of the active areas 18.

Write control input $\overline{WC}$ is supplied from a terminal 29 as shown in FIG. 11, to be inputted in an OR gate 8 through a terminal 9. Output from the OR gate 8 is supplied to write control input terminals 4s of the RAM macrocells 4. On the other hand, a data output control signal (RAM selecting signal) RC is inputted from an input terminal 30e, to be supplied to four RAM blocks 25 through an inverter 31. Output from the inverter 31 is also supplied to remaining four RAM blocks 25 through another inverter 32. In each RAM block 25, the data output control signal RC inputted through the terminal 10 is supplied to data output control terminals 4t of the RAM macrocells 4. The inverters 31 and 32 form a part of a host decoder (not shown), which is formed through use of the active areas 18 of the gate array chip 33 as a part of the logic circuit.

When the data output control signal RC shown in FIG. 12 goes low level, data output operation of the RAM macrocells 4 is disabled. When the data input control signal WC also goes low level, low levels are applied to the data input control terminals 4s of the RAM macrocells 4. Consequently, the RAM macrocells 4 enter write enable states, whereby data inputted from data input terminals 26a to 26d are written in the RAM macrocells 4 through data input terminals 6a to 6d of the RAM block 25. Similarly, other input data inputted from remaining input terminals 26a to 26d are also written in corresponding RAM blocks 25.

When the data output control signal RC goes high level, the data stored in the RAM macrocells 4 are read out through output terminals 7a to 7d, to be outputted from the RAM 100 as output data 27a to 27p.

Figure 13:
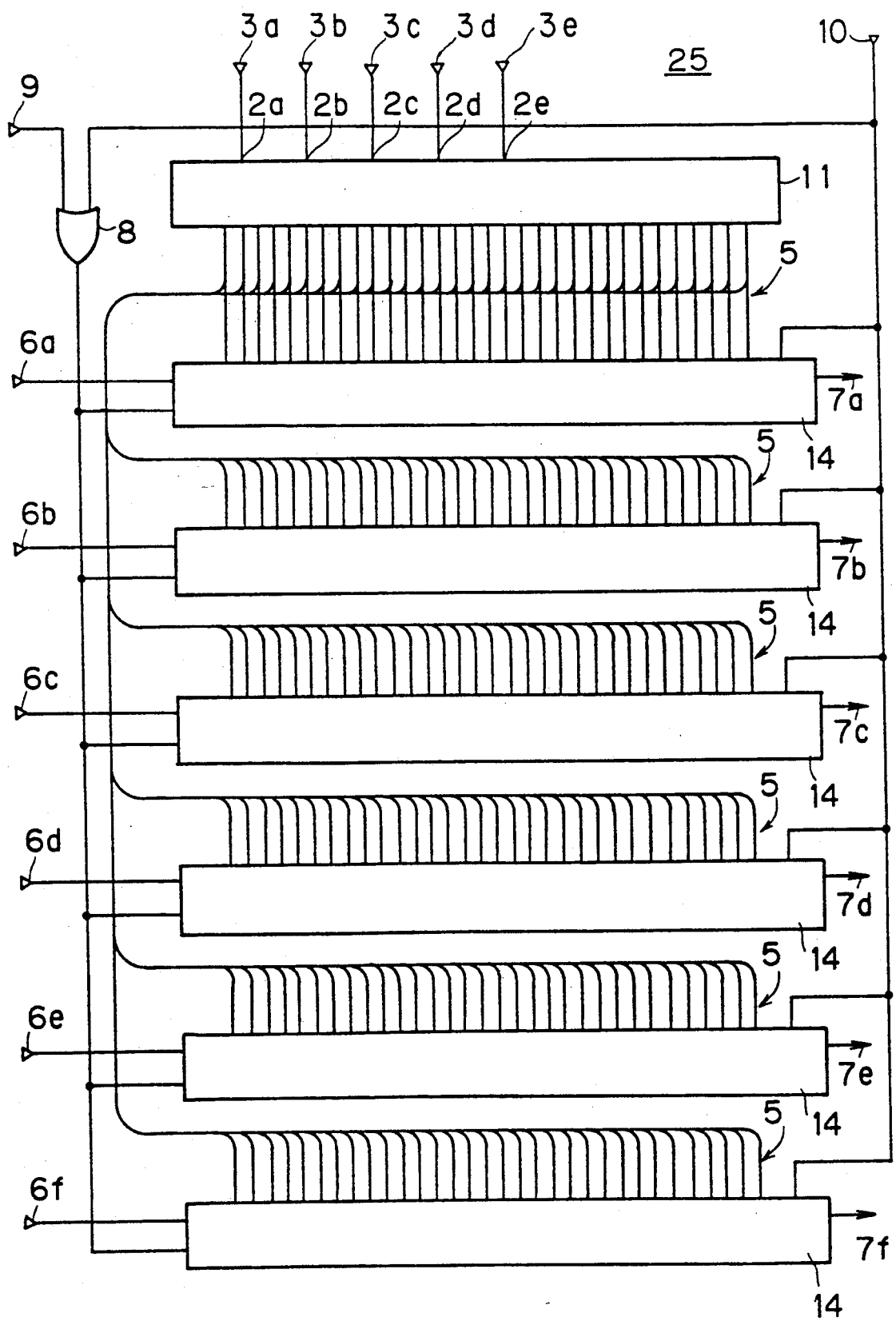
FIG. 13 is a circuit diagram of another memory block.

When each RAM block 25 is formed as a memory of thirty two words by six bits, six RAM macrocells 14 are provided as shown in FIG. 13. Each of the RAM macrocells 14 has thirty two storage cells. The decoder macrocell 11 receives a 5-bit address signal, which is supplied from address input terminals 3a to 3e, through terminals 2a to 2e and decodes the same, to output a word selecting signal through the word lines 5. Input data are inputted from the input terminals 6a to 6f, and output data are outputted from the output terminals 7a to 7f. The remaining structure and operation are identical to those of the RAM block 25 shown in FIG. 12.

It is to be noted that a plurality of word lines 5 are connected to each RAM macrocell 4 in the RAM block 25. Since FIGS. 12 and 13 are circuit diagrams, the word lines 5 are connected to respective RAM macrocells 4 and 14 by shunts. In order to form the RAM blocks 25 on the gate array chip 33, however, the word lines 5 are provided as vertical wires as shown by broken lines 5a in FIG. 12. Thus, interconnection between the RAM macrocells 4 is implemented by a large number of vertical wires and a small number of lateral wires.

Figure 14:
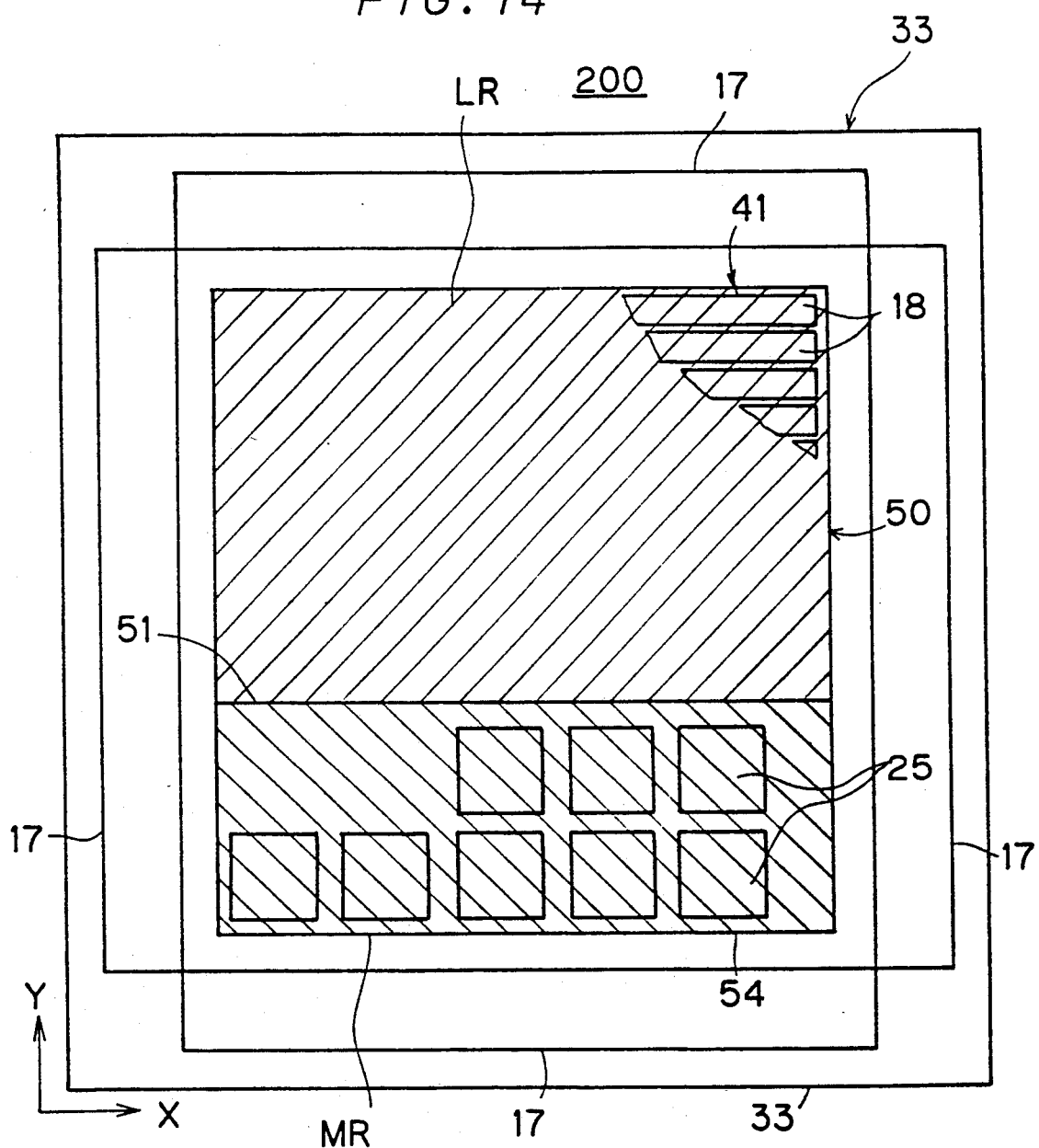
FIG. 14 illustrates positional relation between a logic circuit region and a memory region on the gate array chip.

Since no large number of lateral wires are required in the RAM blocks 25, the RAM blocks 25 can be formed on the gate array chip 33 without employing the active areas 18 as the wiring areas 43. As schematically shown in FIG. 14, a region 50 employed for the logic circuit region LR and the memory region MR, which are separated from each other, is defined on the gate array chip 33 in the master slice LSI 200. Assuming that symbol X represents the longitudinal direction of the active areas 18 and symbol Y represents the direction of array of the active areas 18, the regions LR and MR are separated from each other by a virtual boundary line 51, which is parallel to the direction X. One or more active areas 18 are employed as the wiring areas in the logic circuit region LR, while all of the active areas 18 are employed as the decoder macrocells 1 or the RAM macrocells 4 in the RAM blocks 25.

Figure 15:
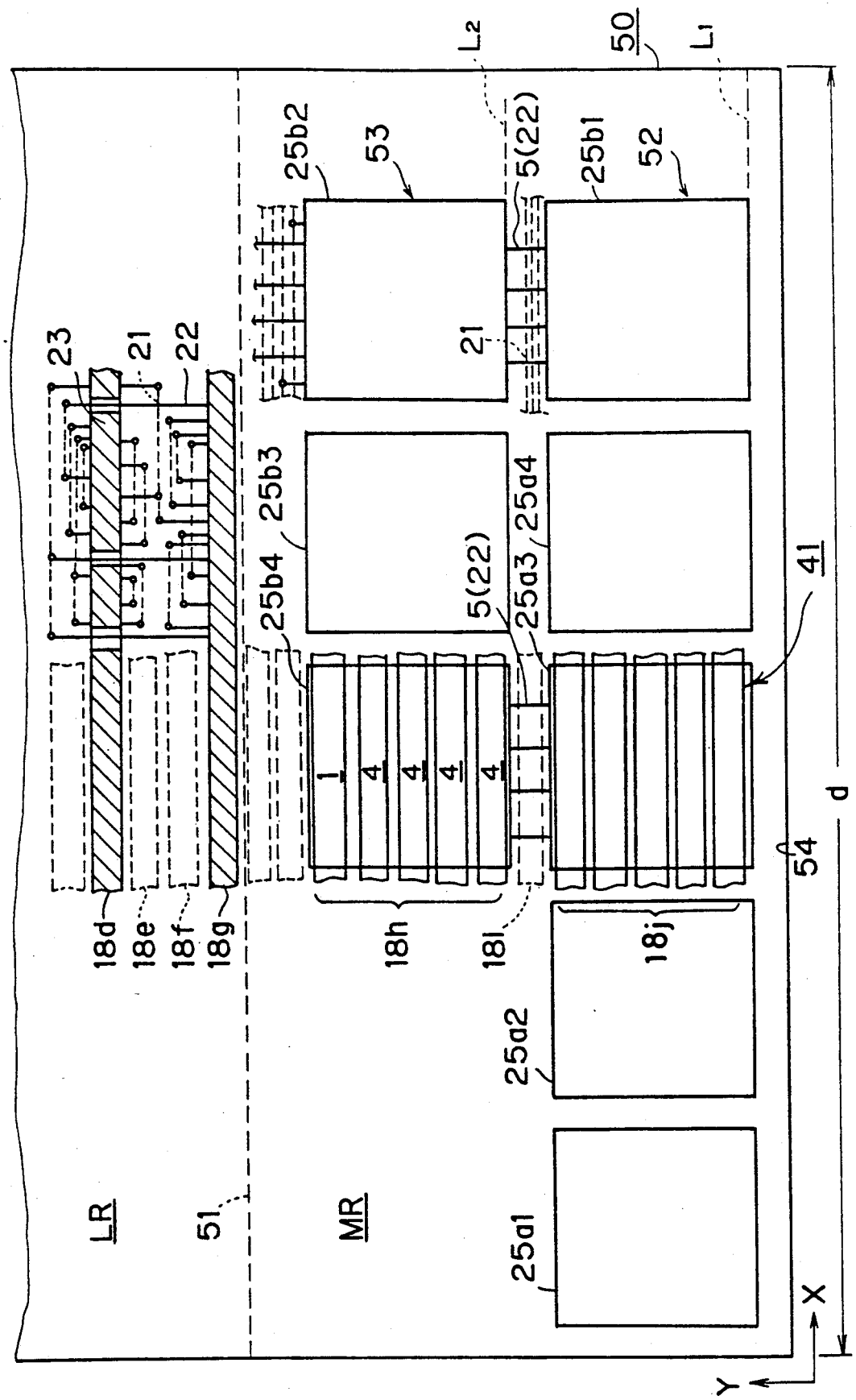
FIG. 15 is a schematic plan view showing the embodiment in detail.

FIG. 15 is a partially enlarged view of the region 50, in which eight RAM blocks 25 are shown as RAM blocks $25a_1$ to $25a_4$ and $25b_1$ to $25b_4$, which are identical in size to each other. Within these, four RAM blocks $25a_1$ to $25a_4$ correspond to the left four RAM blocks 25 of FIG. 11 and the remaining four RAM blocks $25b_1$ to $25b_4$ correspond to the right four RAM blocks 25 of FIG. 11. Further, FIG. 15 shows active areas 18, which are larger in number than the active areas 18 shown in FIG. 8, being present on the gate array chip 33. Five RAM blocks $25a_1$ to $25a_4$ and $25b_1$ are formed through use of five active areas $18j$ which are present at an end portion of the array 41, while being arrayed along a virtual straight line $L_1$, which is parallel to the direction X. If predetermined width d of the memory region MR (length of the active areas 18) is not so much large, it is not possible to array all of the eight RAM blocks $25a_1$ to $25a_4$ and $25b_1$ to $25b_4$ in a row. The remaining three RAM blocks $25b_2$ to $25b_4$, which cannot be formed through use of the active areas $18j$, are arrayed along another virtual straight line $L_2$, which is parallel to the direction X. The RAM blocks $25b_2$ to $25b_4$ are formed through use of active areas $18h$.

A first block row 52 is defined by the RAM blocks $25a_1$ to $25a_4$ and $25b_1$, while a second block row 53 is defined by the RAM blocks $25b_2$ to $25b_4$. An active area $18i$, which is employed as a wiring area, is present between the first and second block rows 52 and 53. Pairs of RAM blocks $(25a_3, 25b_2)$, $(25a_4, 25b_3)$ and $(25b_1, 25b_4)$ form columns along the direction Y, respectively. Namely, the RAM blocks $25a_1$ to $25a_4$ and $25b_1$ to $25b_4$ are arrayed in the form of a partial matrix in or lattice close to an end edge 54 of the memory region MR. If sixteen RAM blocks are present, such RAM blocks form a complete matrix of four by four. The size required for the memory region MR is minimized by employing such a rule of arrangement.

In the logic circuit region LR, for example, active areas $18d$ and $18g$ are employed as logic macrocells 23 (shown with slanting lines), and active areas $18e$ and $18f$ existing between logic macrocells 23 are employed as wiring areas. The active areas $18e$ and $18f$ are not employed as macrocells. Namely, the logic macrocells 23 are formed by skipping use of the active areas 18. Large numbers of lateral wires 21 and vertical wires 22 are provided between the active areas $18d$ and $18g$.

Figure 16:
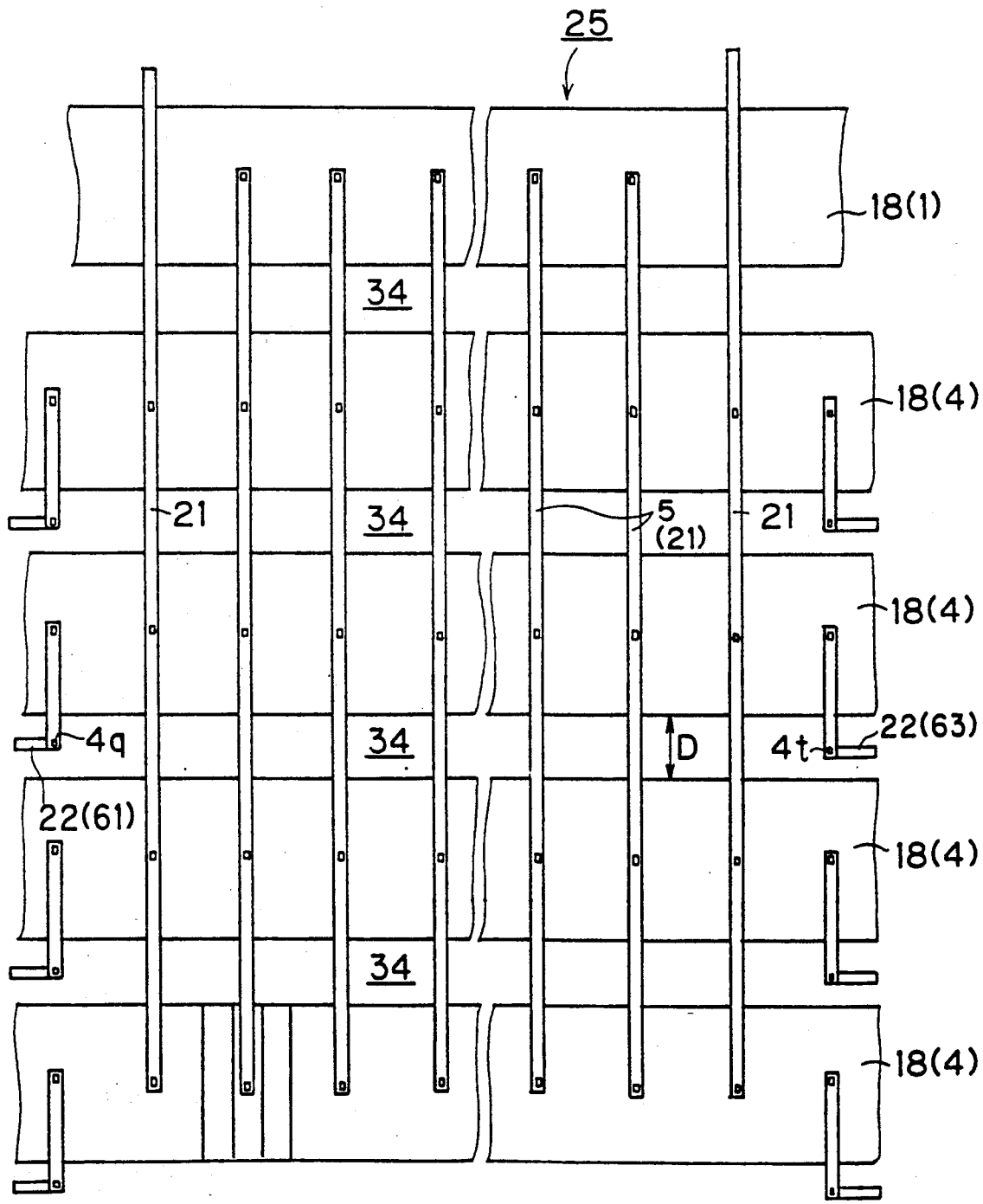
FIG. 16 is a plan view showing wires in the memory region.

FIG. 16 shows the interior of each RAM block 25. Active areas 18 are employed as a decoder macrocell 1 and RAM macrocells 4. Word lines 5 are formed by vertical wires 21. Lateral wires 22 extend from terminals $4t$ and $4g$. As obvious from FIG. 12, each of the RAM macrocells 4 must be connected with four wires 61 to 64 extending from terminals $4q$, $4r$, $4s$ and $4t$ respectively, in addition to the word llines 5. The four wires 61 to 64 are formed by lateral wires 22 provided on the wiring-dedicated areas 34. FIG. 16 shows only the wires 61 and 63. No active areas are employed as wiring areas in the interior of the RAM block 25, but all of the active areas 18 are employed for the macrocells.

Figure 17A:
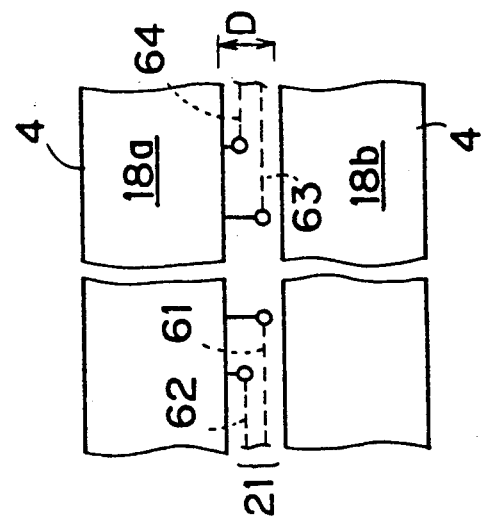
FIGS. 17A to 17C are explanatory diagrams showing the rule for deciding the width of wiring areas.

If all of the wires 61 to 64 extend in one direction (to the left in FIG. 16, for example), four lateral wires 21 must be provided between an adjacent pair of active areas $18a$ and $18b$, as shown in FIG. 17A. In this case, the space D is so sized that the four lateral wires 21 can be provided between the adjacent active areas $18a$ and $18b$. If three wires 61 to 63 extend in one direction and the remaining wire 64 extends in another direction, the space D may have wiring capacity for three wires. If two wires 61 and 62 extend in one direction and the remaining two wires 63 and 64 extend in another direction, the space D may have wiring capacity for two wires.

Figure 17B:
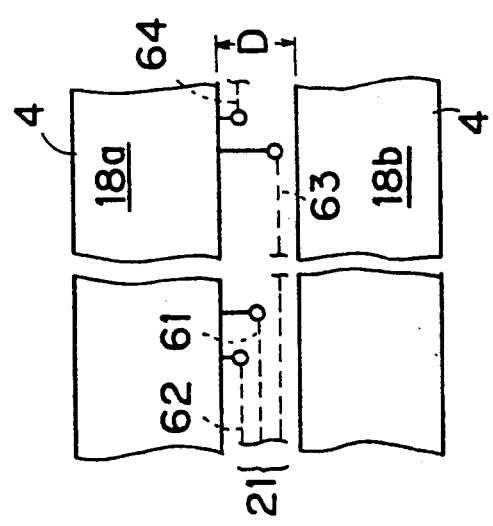
Figure 17C:
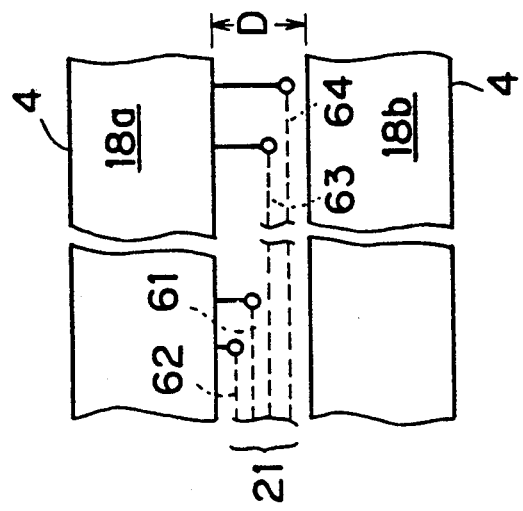

This embodiment can accept both of wiring modes as shown in FIGS. 17B and 17C, since the space D has the wiring capacity for three wires. Technique of arranging the active areas 18 so that the space D has wiring capacity for two or four wires is also included in the scope of the present invention. When, in general, the number of lateral wires 21 to be connected to the RAM macrocells 4 in the RAM blocks 25 is N (N: integer), the width D of each wiring-dedicated area 34 is so determined that the wiring capacity thereof is within a range of N/2 to N. In other words, the wiring capacity of the wiring-dedicated area 34 is determined according to a requirement for lateral wiring to memory macrocell 4.

Figure 18:
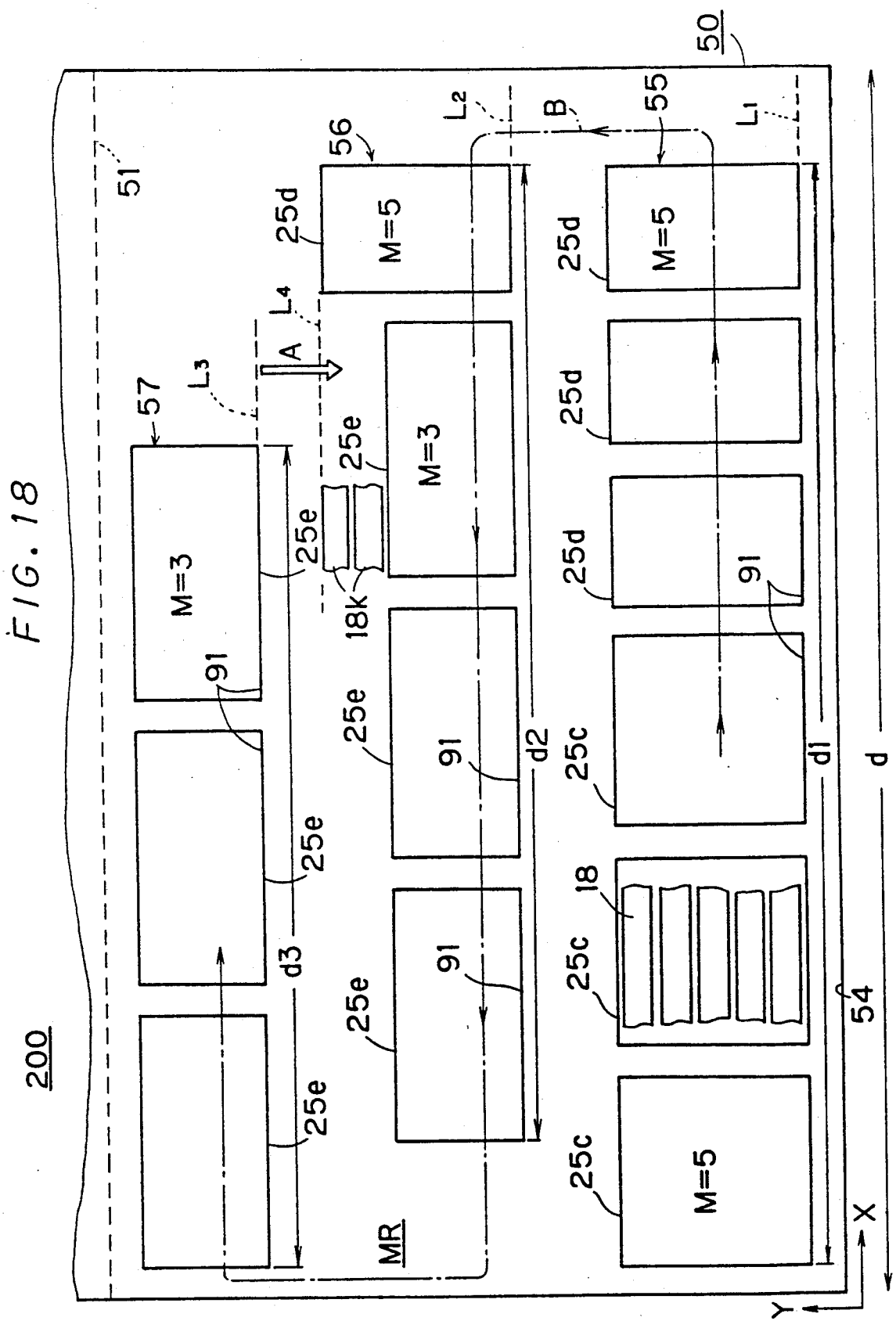
FIG. 18 is an explanatory diagram of positions for arranging memory blocks which are different in size from each other.

The RAM blocks 25 may not be entirely identical in size to each other. Referring to FIG. 18, RAM blocks $25c$, $25d$ and $25e$ are different in size from each other. Assuming that symbol M expresses the number of active areas 18 employed for each of the RAM blocks, $M=5$ in the RAM blocks $25c$ and $25d$. Each of the RAM blocks $25e$ is formed by three active areas 18 ($M=3$). In order to minimize the area required for the memory region MR, RAM blocks having the same value M are arranged in the same block row, as much as possible. Referring to FIG. 18, the RAM blocks $25c$ and $25d$ having the value $M=5$ are arranged in a block row 55. The RAM blocks $25e$ having the value $M=3$ are arranged in a block row 57. The RAM blocks $25e$ having the value $M=3$ and the RAM block $25d$ having the value $M=5$ are arranged in a block row 56. The block rows 55, 56 and 57 are so arranged that their edges 91, being parallel to the direction X, are along imaginary straight lines $L_1$, $L_2$ and $L_3$, which are parallel to the direction X, respectively.

In FIG. 18, the straight line $L_3$ defining the lower edge of the block row 57 is in a higher position position than a straight line $L_4$ defining the higher edge of the block row 56. If the straight line $L_3$ is lowered in position than the straight line $L_4$ as shown by an arrow A, active areas $18k$ will belong to both of the block rows 56 and 57. In the block row 56, the active areas $18k$ must be employed as decoder macrocells or RAM macrocells for the RAM block $25d$. On the other hand, the active areas $18k$ must be employed as wiring areas for interconnecting the block rows 56 and 57. These two requirements are contradictory to each other, and hence effective RAM block arrangement cannot be obtained. Thus, the straight line $L_3$ is set in a higher position than the straight line $L_4$ on a plane defined by the surface of the gate array chip 33. In other words, positions of the block rows 55, 56 and 57 are so determined that the same are not overlapped with each other.

In order to minimize the area required for the memory region MR, the following processes are executed: First, the respective RAM blocks 25c, 25d and 25e are classified in accordance with the values M thereof. For example, the RAM blocks 25c and 25d having the value of M=5 are classified in a first group and the RAM blocks 25e having the value of M=3 are classified in a second group. The RAM blocks 25c and 25e belonging to the first group are imaginarily arranged in sequence along an end edge 54 of the memory region MR. Since the width d of the memory region MR is previously determined, it may be impossible to arrange all of the RAM blocks 25c and 25e in the first block row 55. In such case, a RAM block which cannot be arranged in the first block row 55, i.e., one of the RAM blocks 25d, is arranged in the second block row 56.

In the second block row 56, three RAM blocks 25e are arranged subsequently to the RAM block 25d. If the RAM blocks 25c and 25d are arranged in the first block row 55 sequentially from the left in FIG. 18, the RAM blocks 25d and 25e are arranged in the second block row 56 sequentially from the right. Remaining three RAM blocks 57, which cannot be arranged in the second block row 56, are arranged in the third block row 57 sequentially from the left in FIG. 18. Namely, the step for arranging the RAM blocks 25c, 25d and 25e on the gate array chip 33 includes a process of sequentially arranging the RAM blocks 25c, 25d and 25e in alternate directions along an imaginary staggered trace line B.

Consequently, the RAM blocks 25c, 25d and 25e are imaginarily arranged closely toward the end edge 54. The block rows 55, 56 and 57 are arrayed in the direction Y, from an original line defined by the end edge 54. Within the block rows 55, 56 and 57, at least each of the block rows 55 and 56, other than the last block row 57, includes the maximum number of RAM blocks which can be provided within the range of the width d. Such situation is generally applied to the case of a memory having first to K-th block rows assuming that K represents an interger. The RAM blocks 25c and 25d belonging to the same group are sequentially continuous along the imaginary staggered trace line B.

Upon completion of a trial layout, lengths d1, d2 and d3 of the respective block rows 55, 56 and 57 are calculated. Further, widths of the respective block rows 55, 56 and 57, i.e., maximum values M1, M2 and M3 (not shown) within the values of M corresponding to the RAM blocks included in the respective block rows 55, 56 and 57 are calculated. The lengths d1, d2 and d3 are multiplied by the maximum values M1, M2 and M3 respectively, and values of three products thus obtained are added up. Assuming that d1=10, d2=8 and d3=7 in an arbitrary unit, the sum S is evaluated as follows:

$$\begin{aligned} S &= d1 \times M1 + d2 \times M2 + d3 \times M3 \\ &= 10 \times 5 + 8 \times 5 + 7 \times 3 \\ &= 111 \end{aligned}$$

Then another trial layout in which the RAM blocks 25c, 25d and 25e are imaginarily arrayed in arbitrary sequence different from that shown in FIG. 18 is found, while maintaining the rule of continuously arraying the RAM blocks having the same values of M. After such layout of the RAM blocks is imaginarily executed in the new sequence, the sums S in the new sequence are calculated. These processes are repeatedly executed untill all of the possible trail layouts are considered. All of the values of the sums S thus obtained are compared with each other. A layout having the minimum value of the sum S is found to be employed as the actual layout in the gate array chip 33. As the result, the area of the memory region MR is minimized.

In order to manufacture the master slice LSI 200 in accordance with the present invention, the semiconductor substrate 40 (FIG. 8) is first prepared. Then the strip-shaped active areas 18 and the wiring-dedicated areas 34 each having wiring capacity for few wires (i.e., two, three or four wires) are alternately formed to be arrayed on the semiconductor substrate 40. The input-/output interface buffer areas 17 are also formed on the semiconductor substrate 40. After the gate array chip 33 is thus formed, the region 50 (FIG. 14) employed for the logic circuit region LR and the memory region MR are specified on the surface of the gate array chip 33. Then an end edge 54 of the region 50, which is parallel to the longitudinal direction X of the active areas 18, is specified and the RAM blocks 25 are arranged along the aforementioned layout rule in sequence from the side close to the end edge 54. Arrangement of the logic circuit is also executed in the logic circuit region LR.

The active areas 18 employed as the wiring areas 43 (FIG. 10B) are determined in this layout. No active areas 18 are required to be employed as wiring areas 43 in the block rows 52 and 53 (55, 56 and 57). The active areas 18 which are not employed as the wiring areas 43 are adapted to form macrocells.

Along this layout, the lateral wires 21 and the vertical wires 22 are formed on the gate array chip 33. Internal wires (not shown) of the unit transistor cells 20 belonging to the same active areas 18 are also formed on the active areas 18 which are not employed as the wiring areas 43. Well-known bonding and packaging are performed on the gate array chip 33, thereby to complete the manufacturing processes to obtain a desired master slice LSI.

The RAM blocks 25 have the decoder macrocells 1 and the RAM macrocells 4. The RAM macrocells 4 are mainly interconnected by short vertical wires 22, whereby the degree of integration and the operating speed are improved. Required numbers of lateral wires 21 and vertical wires 22 are provided in the logic circuit region LR. The memory formed on the gate array chip 33 may be prepared by a ROM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a master slice integrated circuit having a logic circuit and a memory circuit, comprising:

a first step of preparing a semiconductor substrate;

a second step of forming an array of strip-shaped active areas on said semiconductor substrate to obtain a gate array chip, each of said active areas having a linear array of active elements, said active elements comprising logic circuit elements and memory circuit elements, said active areas being arrayed along a first direction perpendicular to a second along which said linear array extends, wiring-dedicated areas each having wiring capacity selected only from numbers two, three and four in said second direction being provided between respective adjacent pairs of said active areas;

a third step of determining a layout of said logic circuit and said memory circuit on said gate array chip; and a fourth step of performing wiring on said gate array chip in accordance with said layout, said active areas being partially employed as wiring areas.

2. A method of manufacturing a master slice integrated circuit having a logic circuit and a memory circuit, said memory circuit having a plurality of memory blocks, comprising:

a first step of preparing a semiconductor substrate;

a second step of forming an array of strip-shaped active areas on said semiconductor substrate to obtain a gate array chip, each of said active areas having a plurality of active elements, said active elements comprising logic circuit elements and memory circuit elements, said active areas being arrayed along a first direction perpendicular to a second direction which is a longitudinal direction of said active areas, wiring-dedicated areas each having wiring capacity only selected from numbers two, three and four in said second direction being provided between respective adjacent pairs of said active areas;

a third step of determining a layout of said logic circuit and said memory circuit on said gate array chip, including a first process of specifying a region for forming said logic circuit and said memory circuit on said semiconductor substrate, a second process of specifying an end edge of said region extending in said second direction, and a third process of arranging said plurality of memory blocks in said region closely toward said end edge to form an array of said memory blocks; and a fourth step of performing wiring on said gate array chip in accordance with said layout, said active areas being partially employed as wiring areas.

3. A manufacturing method in accordance with claim 2, wherein said array of said memory blocks is provided in a form of memory block rows arrayed from an original line defined by said end edge, and at least each of said memory block rows other than one of said memory block rows has said memory blocks in a maximum number which can be provided within a range of width of said region in said second direction.

4. A manufacturing method in accordance with claim 3, wherein said array of said memory blocks is obtained by sequentially arranging said memory blocks along an imaginary staggered trace line tracing said memory block rows in alternate directions.

5. A manufacturing method in accordance with claim 4, wherein said memory blocks are not uniform in size in said first direction, said memory blocks are classified into a plurality of groups in accordance with said size in said first direction, and said array of said memory blocks is obtained by sequentially arranging said memory blocks along said imaginary staggered trace line so that said memory blocks belonging to the same group are sequentially continuous along said imaginary staggered trace line.

6. A manufacturing method in accordance with claim 5, wherein respective ones of said memory block rows are formed by arranging said memory blocks so that an edge of each said memory block is present on an imaginary straight line which is parallel to said second direction.

7. A manufacturing method in accordance with claim 6, wherein said memory block rows are not overlapped with each other.

8. A manufacturing method in accordance with claim 7, wherein sequence of arrangement of said groups along said imaginary staggered trace line is so determined that said memory region is minimized in size.

* * * * *